(12) United States Patent
Lee et al.

(10) Patent No.: US 12,085,983 B2
(45) Date of Patent: Sep. 10, 2024

(54) DISPLAY DEVICE

(71) Applicant: Samsung Display Co., LTD., Yongin-si (KR)

(72) Inventors: Hong Kwan Lee, Yongin-si (KR); Yong Hyuck Lee, Cheonan-si (KR); Hyun Jun Cho, Seoul (KR); Sohra Han, Cheonan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 272 days.

(21) Appl. No.: 17/831,451

(22) Filed: Jun. 3, 2022

(65) Prior Publication Data

US 2023/0071229 A1 Mar. 9, 2023

(30) Foreign Application Priority Data

Sep. 7, 2021 (KR) .................. 10-2021-0118976

(51) Int. Cl.
*G06F 1/16* (2006.01)
*H05K 5/00* (2006.01)
*H04M 1/02* (2006.01)
*H10K 59/131* (2023.01)

(52) U.S. Cl.
CPC ......... *G06F 1/1616* (2013.01); *H05K 5/0017* (2013.01); *H04M 1/0268* (2013.01); *H10K 59/131* (2023.02)

(58) Field of Classification Search
CPC .. G06F 1/1616; H05K 5/0017; H04M 1/0268; H10K 59/131
See application file for complete search history.

(56) References Cited

U.S. PATENT DOCUMENTS

| 10,211,421 B2 | 2/2019 | Lee et al. | |
|---|---|---|---|
| 2011/0289809 A1* | 12/2011 | Lee | G09F 9/35 40/718 |
| 2014/0340855 A1* | 11/2014 | Lee | G09F 9/00 361/748 |
| 2015/0363030 A1* | 12/2015 | Nam | G06F 3/041 345/173 |
| 2016/0106012 A1* | 4/2016 | Jang | H05K 9/0086 361/679.55 |
| 2019/0196544 A1* | 6/2019 | Mizoguchi | G06F 1/1652 |
| 2020/0166974 A1* | 5/2020 | Ai | H04M 1/0216 |
| 2022/0113824 A1 | 4/2022 | Kishimoto et al. | |

FOREIGN PATENT DOCUMENTS

| KR | 10-2017-0073948 | 6/2017 |
| KR | 10-1743198 | 6/2017 |
| KR | 10-1832301 | 2/2018 |
| KR | 10-2019-0003257 | 1/2019 |
| KR | 10-2022-0049066 | 4/2022 |

OTHER PUBLICATIONS

Shin, Translation of KR 101743198 B1.*

* cited by examiner

*Primary Examiner* — Jacob R Crum
(74) *Attorney, Agent, or Firm* — CANTOR COLBURN LLP

(57) ABSTRACT

A display device includes: a display module; a plate positioned on a rear surface of the display module; and a digitizer positioned on a rear surface of the plate. The plate includes a first layer, a second layer, and a third layer each including carbon fiber reinforced plastic, and a fiber area weight (FAW) of the second layer is 100 g/m² to 150 g/m².

20 Claims, 22 Drawing Sheets

DISPLAY DEVICE

CROSS-REFERENCE TO RELATED APPLICATION

This application claims priority from and benefits of Korean Patent Application No. 10-2021-0118976, filed on Sep. 7, 2021, which is hereby incorporated by reference for all purposes as if fully set forth herein.

BACKGROUND

Field

Embodiments of the invention relate generally to a display device, and more particularly, to a display device capable of improving display quality.

Discussion of the Background

As information technology has developed, the importance of a display device, which is a connection medium between a user and information, has been highlighted.

Recently, research and development of a foldable display device, a bendable display device, a rollable display device, etc. using the advantages of a flexible display panel that can be bent or folded are being conducted. Such a display device may be applied to various fields, such as a television and a monitor, as well as a portable electronic device, and a wearable device.

In recent years, portable electronic devices such as smart phones and tablet PCs have become lighter and thinner for portability, and are being developed in various ways for ease of use. In particular, a foldable electronic device with a flexible display provides a relatively larger screen than a general bar type of electronic device, but when the electronic device is folded, its size is reduced and it is convenient to carry on a person, and thus, it is in the spotlight as an electronic device to satisfy consumer preferences.

The above information disclosed in this Background section is only for understanding of the background of the inventive concepts, and, therefore, it may contain information that does not constitute prior art.

SUMMARY

One or more inventive concepts consistent with one or more embodiments provide a display device that is easy to fold and has improved display quality.

Additional features of the inventive concepts will be set forth in the description that follows, and in part will be apparent from the description, or may be learned by practice of the inventive concepts.

An embodiment provides a display device including: a display module; a plate positioned on a rear surface of the display module; and a digitizer positioned on a rear surface of the plate, wherein the plate includes a first layer, a second layer and a third layer each including carbon fiber reinforced plastic, and a fiber area weight (FAW) of the second layer is 100 g/m² to 150 g/m².

FAWs of the first layer and the third layer may be 20 g/m² to 30 g/m².

A FAW of the plate may be 160 g/m² to 210 g/m².

A thickness of the second layer may be 90 μm to 150 μm.

Thicknesses of the first layer and the third layer may be the same, and a thickness of each of the first layer and the third layer may be 30 μm to 40 μm.

A thickness of the plate may be 150 μm to 250 μm.

The first layer to the third layer may include a plurality of carbon fibers, a longitudinal direction of a first carbon fiber included in the first layer and the third layer may be parallel to a first direction, and a longitudinal direction of a second carbon fiber included in the second layer may be parallel to a second direction.

The display device may be folded based on a folding axis, and the folding axis may be parallel to the first direction.

The plate may include a folding area overlapping the folding axis and a folding peripheral area not overlapping the folding axis, and the plate may have a plurality of grooves positioned in the folding area.

An elastic modulus of the plate in the first direction may be greater than that in the second direction.

An embodiment provides a display device including: a display module that is fordable with respect to a folding axis; and a plate positioned on a rear surface of the display module, wherein the plate includes a first layer, a second layer and a third layer each including carbon fiber reinforced plastic, a fiber area weight (FAW) of the second layer is 100 g/m2 to 150 g/m2, and an elastic modulus of the plate in a direction perpendicular to the folding axis is smaller than that in a direction that is parallel to the folding axis.

The display device may further include a digitizer positioned on a rear surface of the plate.

According to the embodiment, it is possible to provide a display device that is easy to fold and has improved display quality.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
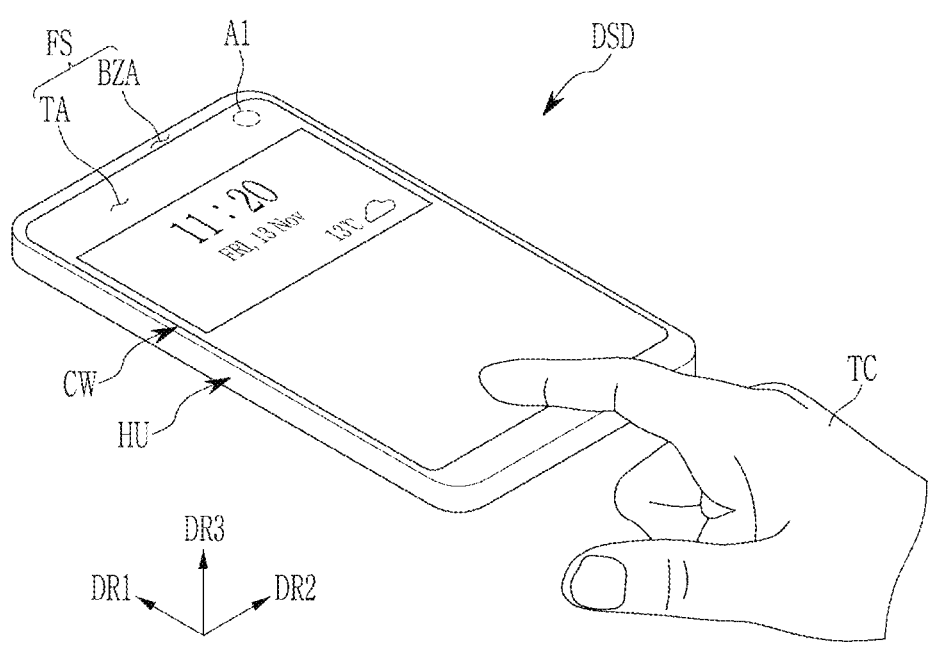
FIG. 1 illustrates a schematic perspective view of a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of is some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to various embodiments will be described in detail with reference to the drawings. However, contents described below are only examples, and the invention as described hereinbelow is not limited thereto.

Figure 2:
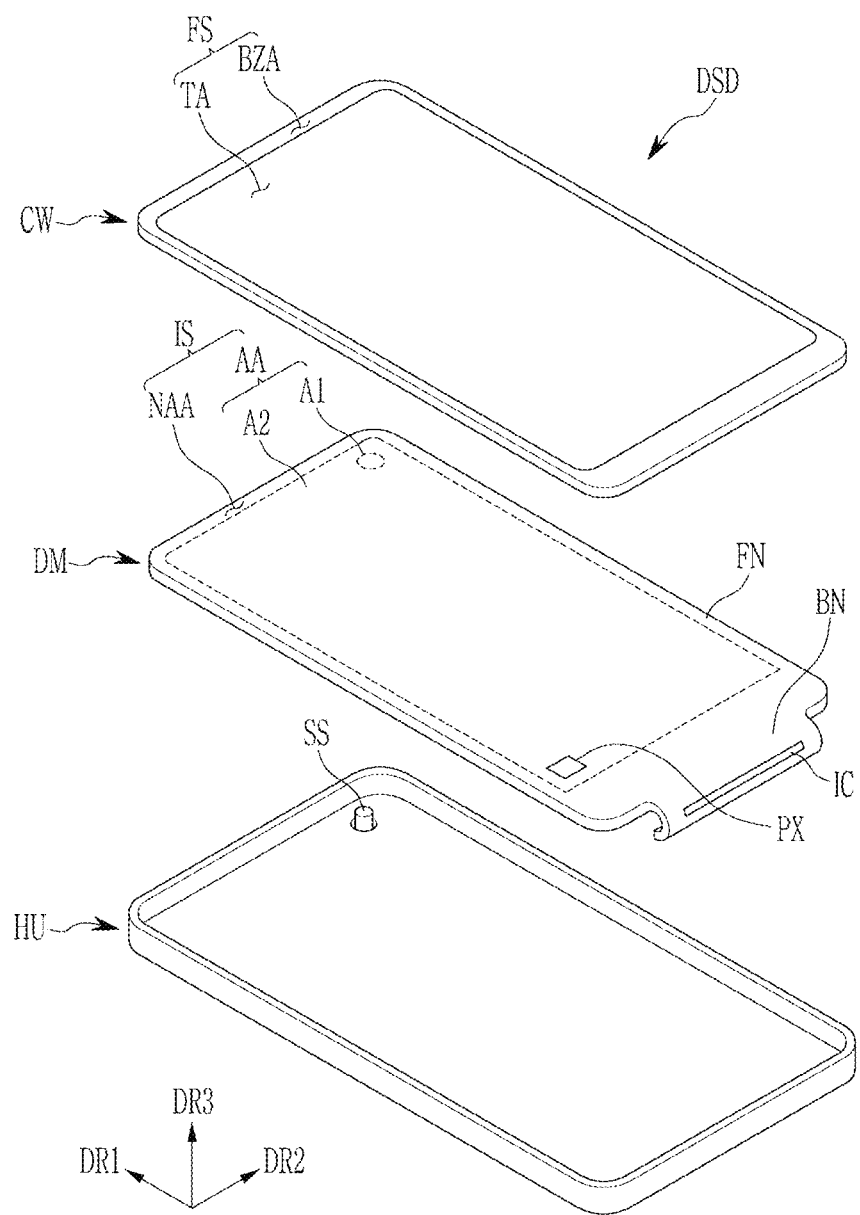
FIG. 2 illustrates an exploded perspective view of a display device according to an embodiment.
Figure 3:
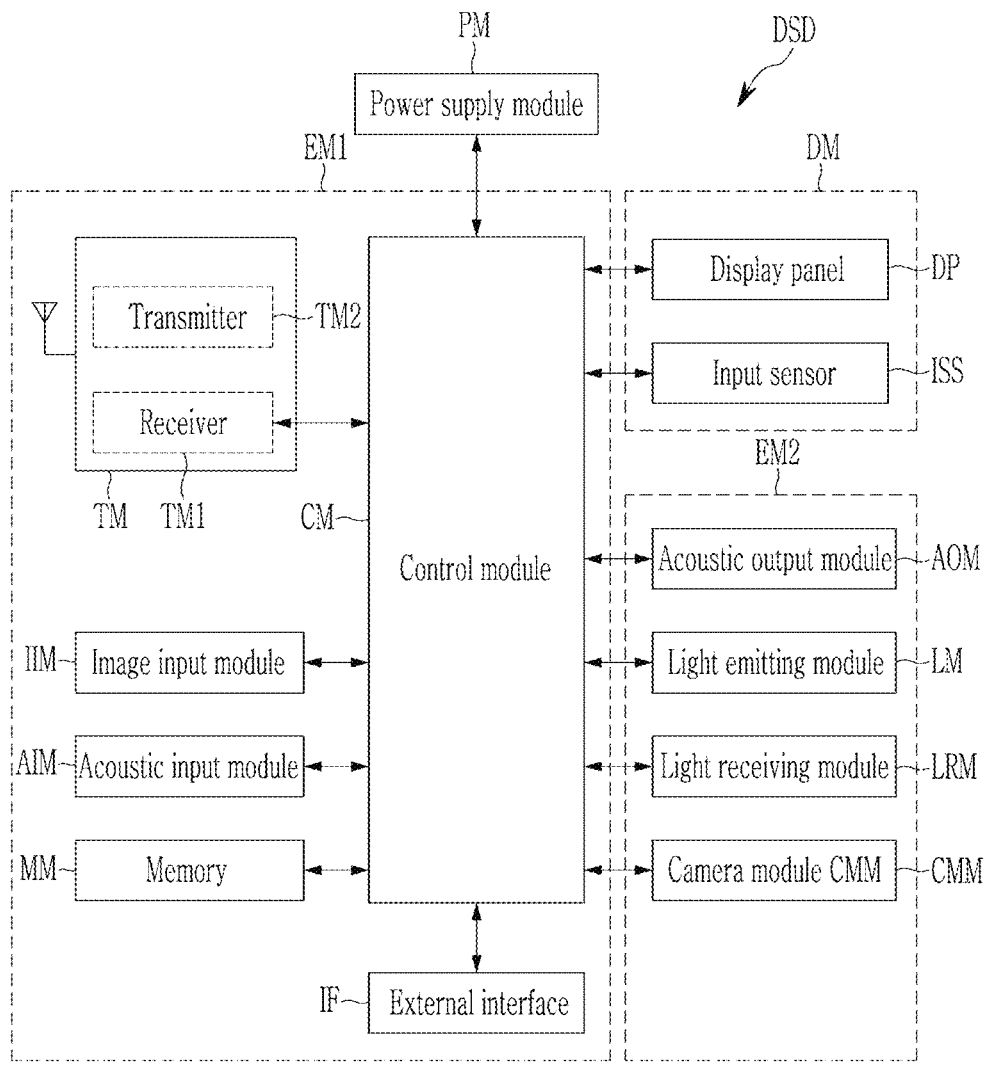
FIG. 3 illustrates a block diagram of a display device according to an embodiment.

FIG. 1 illustrates a schematic perspective view of a display device according to an embodiment that is constructed according to principles of the invention, FIG. 2 illustrates an exploded perspective view of a display device according to an embodiment, and FIG. 3 illustrates a block diagram of a display device according to an embodiment.

A display device DSD according to an embodiment, which is a device that displays a moving image or a still image, may be used as a display screen for various products such as televisions, laptops, monitors, billboards, and Internet of things (JOT) in addition to portable display devices such as mobile phones, smart phones, tablet PCs, mobile communication terminals, electronic notebooks, e-books, PMPs, navigation systems, UMPCs, etc. In addition, the display device DSD according to an embodiment may be used in a wearable device such as a smart watch, a watch phone, a glasses display, or a head mounted display (HMD). In addition, the display device DSD according to an embodiment may be used as an instrument panel of a vehicle, a center information display (CID) provided at a center fascia or dashboard of a vehicle, a room mirror display that replaces a side mirror of a vehicle, or a display provided on a back surface of a front seat of a vehicle. FIG. 1 illustrates that the display device DSD is used as a smart phone for convenience of description.

Referring to FIG. 1 and FIG. 2, the display device DSD may display an image in a third direction DR3 on a display surface parallel to each of a first direction DR1 and a second direction DR2. The image may include a still image as well as a dynamic image. FIG. 1 illustrates a clock as an example of the image.

In the embodiment, of FIG. 1 and FIG. 2, a front surface (or upper surface) and a rear surface (or lower surface) of each member are defined based on a direction in which the image is displayed. The front and rear surfaces may be opposite to each other in the third direction DR3, and a normal direction of each of the front and rear surfaces may be parallel to the third direction DR3.

The display device DSD according to an embodiment may sense a user input TC applied from the outside. The user input TC may include various types of external inputs, such as a part of a user's body, light, heat, or pressure. In one embodiment, the user input TC is illustrated as a user hand applied to the front surface. However, the embodiment described herein is not limited thereto. The user input TC may be provided in various forms, and in addition, the display device DSD may sense the user input TC applied to the side surface or the rear surface of the display device DSD depending on a structure of the display device DSD.

A front surface FS of a cover window CW may define the front surface of the display device DSD. The front surface FS of the cover window CW may include a transmitting area TA and a bezel area BZA. The transmitting area TA may be an optically transparent area. For example, the transmitting area TA may be an area having visible light transmittance of about 90% or more.

The bezel area BZA may be adjacent to the transmitting area TA, and may be positioned around the transmitting area TA. The bezel area BZA may be an area having relatively low light transmittance compared to the transmitting area TA. The bezel area BZA may include an opaque material that blocks light. The bezel area BZA may have a predetermined color. The bezel area BZA may be defined by a bezel layer provided separately from a transparent substrate defining the transmitting area TA, or may be defined by an ink layer formed by being inserted or colored in the transparent substrate.

A first area A1 may be positioned inside the transmitting area TA. The first area A1 may be an area that at least partially overlaps an electronic module SS. Although FIG. 1 illustrates that the first area A1 is provided to have a circular shape at an upper right side of the display device DSD, the embodiment described herein is not limited thereto. The first area A1 may be provided in various numbers and shapes depending on a number and shape of the electronic modules SS.

The display device DSD may receive an external signal required for the electronic module SS through the first area A1, or may supply a signal outputted from the electronic module SS to the outside of the display device DSD. In an embodiment, since the first area A1 overlaps the transmitting area TA, an area of the bezel area BZA may be reduced.

Referring to both FIG. 1 and FIG. 2, the display device DSD may include the cover window CW, a housing HU, a display module DM, and the electronic module SS. In an embodiment, the cover window CW and the housing HU may be combined to form an outer appearance of the display device DSD.

The cover window CW may include an insulating panel. For example, the cover window CW may be formed of glass, plastic, or a combination thereof.

The display module DM may include a front surface IS including an active area AA and a peripheral area NAA. The active area AA may be an area activated depending on an electrical signal.

In an embodiment, the active area AA may be an area in which an image is displayed, and may be an area in which the external input TC is sensed at the same time. The active area AA may be an area in which a plurality of pixels PX to be described later are positioned.

The transmitting area TA may at least partially overlap the active area AA. For example, the transmitting area TA may overlap an entire surface of the active area AA, or may overlap at least a portion of the active area AA. Accordingly, a user may view an image through the transmitting area TA, or provide the external input TC. However, the embodiment described herein is not limited thereto. For example, an area in which an image is displayed and an area in which the external input TC is sensed may be separated from each other in the active area AA.

The peripheral area NAA may at least partially overlap the bezel area BZA. The peripheral area NAA may be an area covered by the bezel area BZA. The peripheral area NAA may be adjacent to the active area AA. The periphery area NAA may surround the active area AA. The peripheral area NAA may be an area in which an image is not displayed. A driving circuit or a driving wire for driving the active area AA may be positioned in the peripheral area NAA.

In an embodiment, the display module DM may be assembled in a flat state in which the active area AA and the peripheral area NAA face the cover window CW. However, the embodiment described herein is not limited thereto. A portion of the peripheral area NAA of the display module DM may be bent. In this case, a portion of the peripheral area NAA faces the rear surface of the display device DSD, so that the bezel area BZA shown on the front surface of the display device DSD may be reduced. Alternatively, the display module DM may be assembled in a state where a portion of the active area AA is bent. Alternatively, in the display module DM, the peripheral area NAA may be omitted in some implementations of the embodiment.

The active area AA may include the first area A1 and a second area A2. The first area A1 may have relatively higher light transmittance than the second area A2. In addition, the first area A1 may have a relatively smaller area than the second area A2. The first area A1 may be defined as an area overlapping an area in which the electronic module SS is positioned inside the housing HU in the display module DM. In an embodiment, the first area A1 is illustrated in a circular shape, but the embodiment described herein is not limited thereto, and the first area A1 may have various shapes such as a polygon, an ellipse, or a figure having at least one curve.

The second area A2 may be adjacent to the first area A1. In an embodiment, the second area A2 may surround an entire first area A1. However, the embodiment described herein is not limited thereto. The second area A2 may partially surround the first area A1.

Referring to FIG. 3 in addition to FIG. 1 and FIG. 2, the display module DM may include a display panel DP and an input sensor ISS. The display panel DP may be configured to generate an image. The image generated by the display panel DP may be displayed on the front surface through the transmitting area TA, and may visually recognized by the user from the outside.

The input sensor ISS may sense the external input TC applied from the outside. The input sensor ISS may sense the external input TC provided to the cover window CW.

Referring to FIG. 2 again, the display module DM may include a flat portion FN and a bending portion BN. The planar portion FN may be assembled in a state of being substantially parallel to a plane defined by the first direction DR1 and the second direction DR2. The active area AA may be provided in the planar portion FN.

The bending portion BN extends from the flat portion FN, and at least a portion of the bending portion BN may be bent. The bending portion BN may be assembled to be bent from the flat portion FN and positioned at a rear side of the flat portion FN. When the bending portion BN is assembled, it overlaps the planar portion FN in a plan view, so that the bezel area BZA of the display device DSD may be reduced. However, the embodiment described herein is not limited thereto. For example, the bending portion BN may be omitted in some implementations of the embodiment.

A driving circuit IC may be mounted on the bending portion BN. The driving circuit IC may be provided in the form of a chip. However, the embodiment described herein is not limited thereto. The driving circuit IC may be provided on a separate circuit board to be electrically connected to the display module DM through a flexible film or the like.

The driving circuit IC may be electrically connected to the active area AA to transmit an electrical signal to the active area AA. For example, the driving circuit IC may include a data driving circuit, and may supply data signals to the pixels PX positioned in the active area AA. Alternatively, the driving circuit IC may include a touch driving circuit, and may be electrically connected to an input sensor positioned in the active area AA. The driving circuit IC may include various circuits in addition to the above-described circuits, or may be designed to supply various electrical signals to the active area AA.

The display device DSD may further include a main circuit board that is electrically connected to the driving circuit IC. The main circuit board may include various driving circuits for driving the display module DM or connectors for supplying power, etc. The main circuit board may be a rigid printed circuit board (PCB) or a flexible circuit board.

The electronic module SS may be positioned under the display module DM. The electronic module SS may receive an external input transferred through the first area A1, or may output a signal through the first area A1. In an embodiment, since the first area A1 having relatively high transmittance is provided inside the active area AA, the electronic module SS may be positioned to overlap the active area AA, and thus an area (or size) of the region BZA may be reduced.

Referring to FIG. 3, the display device DSD may include a display module DM, a power supply module PM, a first electronic module EM1, and a second electronic module EM2. The display module DM, the power supply module PM, the first electronic module EM1, and the second electronic module EM2 may be electrically connected to each other. In FIG. 3, the display panel DP and the input sensor ISS in a configuration of the display module DM are illustrated.

The power supply module PM may supply power required for an overall operation of the display device DSD. The power supply module PM may include a conventional battery module.

The first electronic module EM1 and the second electronic module EM2 may include various functional modules for operating the display device DSD. The first electronic module EM1 may be directly mounted on a motherboard that is electrically connected to the display panel DP, or may be mounted on a separate board to be electrically connected to the motherboard through a connector.

The first electronic module EM1 may include a control module CM, a wireless communication module TM, an image input module IIM, an audio input module AIM, a memory MM, and an external interface IF. Some of the modules may not be mounted on the motherboard, but may be electrically connected to the motherboard through a flexible circuit board.

The control module CM may control the overall operation of the display device DSD. The control module CM may be a microprocessor. For example, the control module CM activates or deactivates the display panel DP. The control module CM may control other modules such as the image input module IIM and the audio input module AIM based on a touch signal received from the display panel DP.

The wireless communication module TM may transmit/receive a wireless signal to/from another terminal using a Bluetooth or Wi-Fi line. The wireless communication module TM may transmit/receive a voice signal using a general communication line. The wireless communication module TM includes a transmitter TM1 that modulates and transmits a signal to be transmitted, and a receiver TM2 that demodulates the received signal.

The image input module TIM may process an image signal, and may convert it into image data that can be displayed on the display module DM. The sound input module AIM may receive an external sound signal by a microphone in a recording mode, a voice recognition mode, and the like, and may convert it into electrical voice data.

The external interface IF may serve as an interface connected to an external charger, a wired/wireless data port, a card socket (e.g., a memory card, a SIM/UIM card), and the like.

The second electronic module EM2 may include an audio output module AOM, a light emitting module LM, a light receiving module LRM, a camera module CMM, and the like. The second electronic module EM2 may be mounted directly on the motherboard, may be mounted on a separate board, and may be electrically connected to the display module DM through a connector or the like, or may be electrically connected to the first electronic module EM1.

The sound output module AOM may convert sound data received from the wireless communication module TM or sound data stored in the memory MM to output the converted sound data to the outside.

The light emitting module LM may generate and output light. The light emitting module LM may output infrared rays. For example, the light emitting module LM may include an LED element. For example, the light receiving module LRM may sense infrared rays. The light receiving module LRM may be activated when infrared rays of a predetermined level or more are sensed. The light receiving module LRM may include a CMOS sensor. After infrared light generated by the light emitting module LM is outputted, it is reflected by an external subject (e.g., a user's finger or face), and the reflected infrared light may be incident on the light receiving module LRM. The camera module CMM may capture an external image.

In an embodiment, the electronic module SS may include at least one of components of the first electronic module EM1 and the second electronic module EM2. For example, the electronic module SS may include at least one of a camera, a speaker, a light sensor, or a heat sensor. The electronic module SS may sense an external object received through the front surface, or may supply a sound signal such as a voice through the front surface to the outside. In addition, the electronic module SS may include a plurality of components, which is not limited to any one embodiment.

Referring to FIG. 2 again, the housing HU may be coupled to the cover window CW. The cover window CW may be positioned on the front surface of the housing HU. The housing HU may be coupled to the cover window CW to provide a predetermined accommodation space. The display module DM and the electronic module SS may be accommodated in the predetermined accommodation space provided between the housing HU and the cover window CW.

The housing HU may include a material having relatively high rigidity. For example, the housing HU may include a plurality of frames and/or plates made of glass, plastic, metal, or a combination thereof. The housing HU may stably protect components of the display device DSD accommodated in an internal space from external impact.

Figure 4:
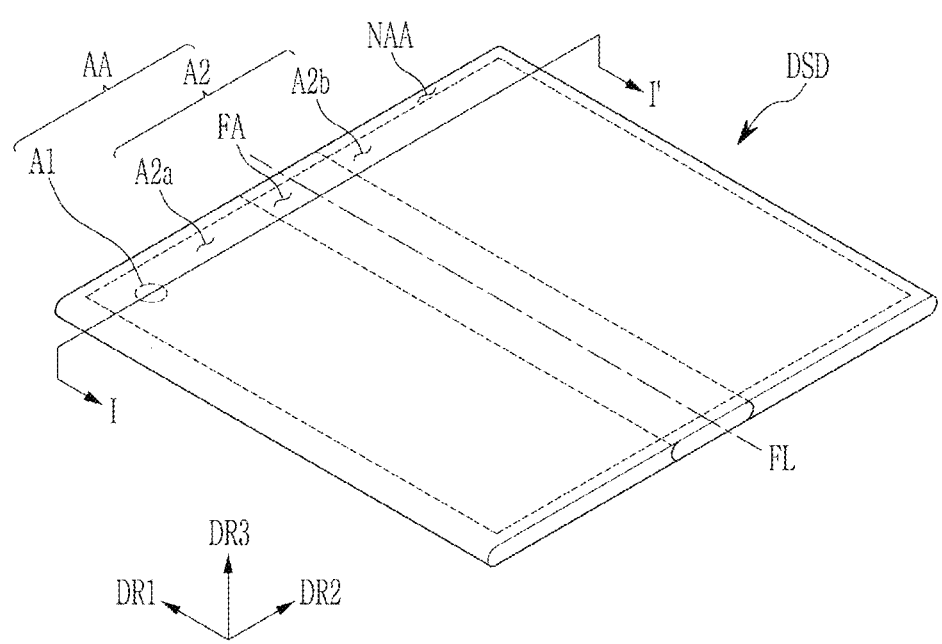
FIG. 4 illustrates a schematic perspective view of a display device according to an embodiment.

A display device according to an embodiment will now be described with reference to FIG. 4. FIG. 4 illustrates a schematic perspective view of a display device according to an embodiment.

Referring to FIG. 4, in an embodiment, the display device DSD may be a foldable display device DSD. The display device DSD may be folded based on (or with respect to) a folding axis FL. For example, the display device DSD may be folded with respect to (or based on) the folding axis FL.

The display device DSD may include a housing, a display module, and a cover window.

In an embodiment, the display module may include an active area AA and a peripheral area NAA. The active area AA is an area in which an image is displayed, and may be an area in which an external input is sensed at the same time. The active area AA may be an area in which a plurality of pixels to be described later are positioned.

The active area AA may include the first area A1 and a second area A2. In is addition, the second area A2 may include a second-1 area A2a, a second-2 area A2b, and a folding area FA. The second-1 area A2a and the second-2 area A2b may be positioned at a left and a right side, respectively, based on (with respect to) the folding axis FL, and the folding area FA may be positioned between the second-1 area A2a and the second-2 area A2b. However, the embodiment described herein is not limited thereto.

Figure 5:
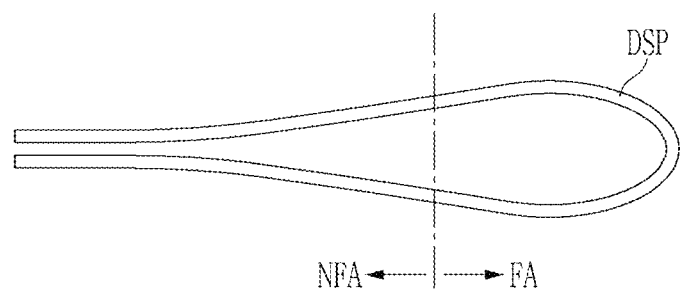
FIG. 5 and FIG. 6 illustrate cross-sectional views showing a case in which a display device is folded along a folding axis according to an embodiment.
Figure 6:
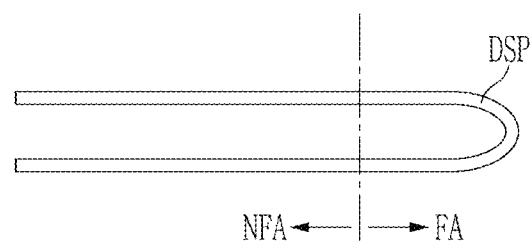

FIG. 5 and FIG. 6 illustrate cross-sectional views showing a case in which a display device is folded along a folding axis according to an embodiment.

As illustrated in FIG. 5 and FIG. 6, the display device DSD includes a folding area FA that is folded based on a folding axis and a folding peripheral area NFA. In this case, as illustrated in FIG. 5, a curvature at which the folding area FA is bent and a curvature at which an area around the folding NFA is bent may be different, or as illustrated in FIG. 6, the folding area FA may be folded to have the same curvature, and the folding peripheral area NFA may be flat.

Figure 7:
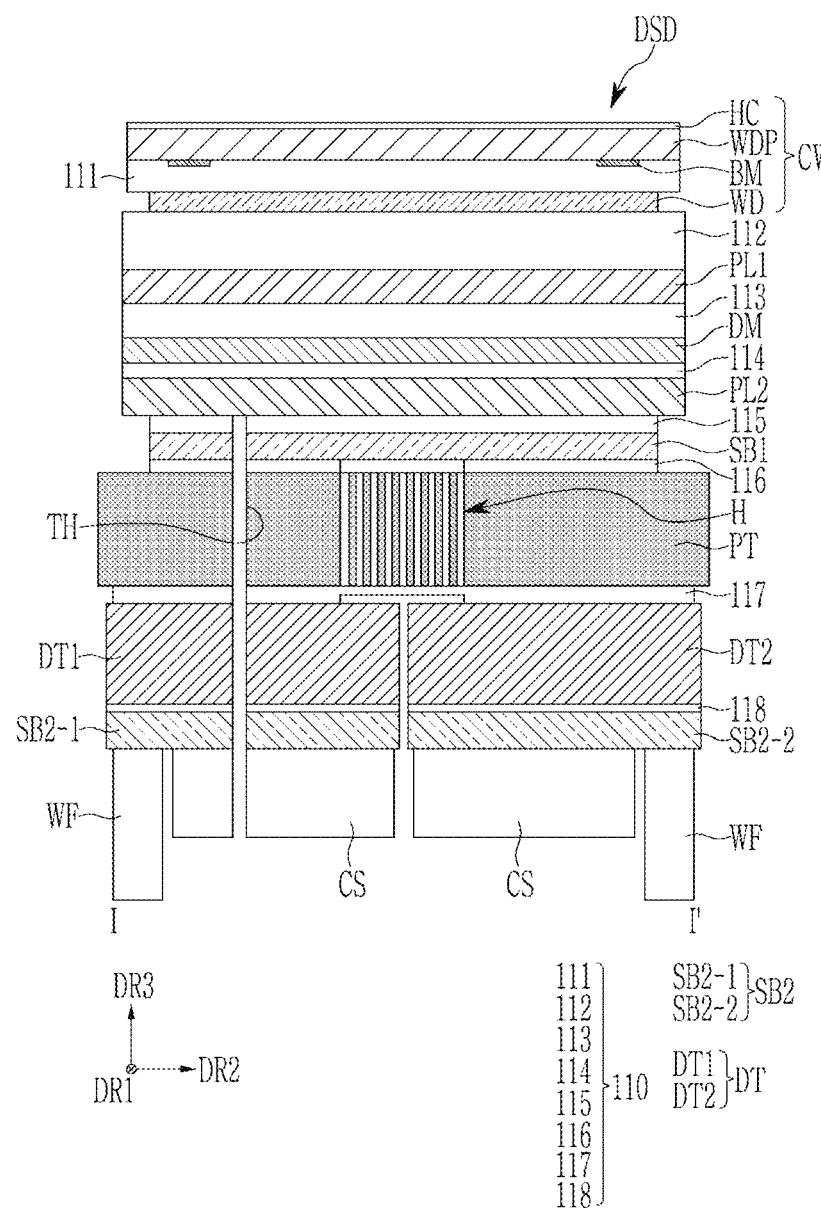
FIG. 7 illustrates a cross-sectional view taken along a line I-I' of FIG. 4.

Hereinafter, a cross-section of a display device according to an embodiment will be described with reference to FIG. 7. FIG. 7 illustrates a schematic cross-sectional view of a display device according to an embodiment. FIG. 7 illustrates a cross-sectional view taken along a line I-I' of FIG. 4.

Referring to FIG. 7 in addition to FIG. 4, the display device DSD includes a cover window CW, a first protection member PL1, a display module DM, a second protection member PL2, a first support member SB1, a plate PT, and a digitizer DT, and a second support member SB2, a cushion layer CS, a waterproof member WF, and an adhesive layer 110 positioned between structures. The adhesive layer 110 may include a first adhesive layer 111 to an eighth adhesive layer 118.

The first protection member PL1 may be positioned at an upper portion of the display module DM. The first protective member PL1 may be adhered to an upper surface of the display module DM through a third adhesive layer 113. In this case, the third adhesive layer 113 may be a pressure sensitive adhesive (PSA). However, the embodiment described herein is not limited thereto. The third adhesive layer 113 may be formed of an optically clear adhesive (OCA).

The first protection member PL1 may be positioned at the upper portion of the display module DM to protect the display module DM from external impact. The first protective member PL1 may be formed of a polymer resin. For example, the first protective member PL1 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the embodiment described herein is not limited thereto. The first protection member PL1 may be made of a material such as glass or quartz.

The cover window CW may be positioned at an upper portion of the first protection member PL1. The cover window CW may be adhered to the upper surface of the first protection member PL1 through the second adhesive layer 112.

The cover window CW may include a window WD, an opaque layer BM, a window protection member WDP, and a hard coating layer HC. The window WD may be made of glass. However, the embodiment described herein is not limited thereto. The window WD may be made of a polymer resin.

The window protection member WDP may be positioned at an upper portion of the window WD. The window protection member WDP may be adhered to the upper surface of the window WD through the first adhesive layer 111. The window protection member WDP may protect the window WD from external impact, and may prevent or minimize scratches on the upper surface of the window WD. The window protection member WDP may be formed of a polymer resin. However, the embodiment described herein is not limited thereto. The window protection member WDP may be formed of an inorganic material.

The opaque layer BM may be provided between the window protection member WDP and the first adhesive layer 111. However, the embodiment described herein is not limited thereto. The opaque layer BM may be provided at a portion of the window protection member WDP. The opaque layer BM may be formed of an opaque material such that wires, circuits, or the like of the display module DM are not identified from the outside. A portion where the opaque layer BM is positioned may be the bezel area BZA.

A hard coating layer HC may be positioned at the upper portion of the window protection member WDP. The hard coating layer HC may be formed of an organic material such as a polymer resin. However, the embodiment described herein is not limited thereto. The hard coating layer HC may be formed of an inorganic material.

The hard coating layer HC may be an outermost layer of the cover window CW. In this case, the outermost layer of the cover window CW may indicate an outermost layer of the display device DSD. The outermost layer of the cover window CW is a layer directly touched by a user, and when the outermost layer of the cover window CW is the window WD or the window protection member WDP, touch feeling of the user may be reduced. Since the outermost layer of the cover window CW is provided as the hard coating layer HC, smooth and soft touch feeling may be provided to the user.

The second protection member PL2 may be positioned at a lower portion of the display module DM. The second protection member PL2 may be adhered to the lower surface of the display module DM through a fourth adhesive layer 114. The second protection member PL2 may be positioned at a lower portion of the display module DM to support the display module DM and to protect the display module DM from external impact. The second protection member PL2 may be made of a polymer resin such as polyethylene terephthalate or polyimide.

A first support member SB1 may be positioned at a lower portion of the second protection member PL2. The first support member SB1 may be adhered to the second protective member PL2 through a fifth adhesive layer 115. The first support member SB1 may be positioned at the lower portion of the display module DM to support the display module DM. The first support member SB1 may be made of a polymer resin such as polyethylene terephthalate or polyimide.

The plate PT may be positioned at a lower portion of the first support member SB1. The plate PT may be adhered to the first support member SB1 through a sixth adhesive layer 116. In an embodiment, the sixth adhesive layer 116 may not be provided in a portion corresponding to the folding area FA.

The plate PT may be positioned at the lower portion of the display module DM to support the display module DM. In addition, the plate PT may be positioned above the digitizer DT to be described later to protect the digitizer DT from external impact.

In an embodiment, the plate PT may have a plurality of grooves H. By the action of the grooves H, the plate PT may be folded based on the folding axis FL. That is, in an embodiment, when the display device DSD is folded, the plate PT may be folded based on (or with respect to) the folding axis FL. In an embodiment, the plate PT excluding the grooves H may have a flat upper surface. In this case, the formation of the grooves H may be made by using a laser or abrasive particles.

The digitizer DT may be positioned at a lower portion of the plate PT. The digitizer DT may detect strength, direction, etc. of a signal that is inputted from an electronic pen or the like. The digitizer DT may be coupled to the plate PT through a seventh adhesive layer 117.

In an embodiment, the digitizer DT includes a first digitizer DT1 positioned at a left side and a second digitizer DT2 positioned at a right side based on (or with respect to) the folding axis FL.

The digitizer DT may be made of a metal. In this case, in the embodiment described herein, since the plate PT does not contain a metal and is made of reinforced plastic, the plate PT may not affect a recognition rate of the digitizer DT. That is, when the plate PT has conductivity, the recognition rate of the digitizer DT may be reduced, but the plate PT according to the embodiment described herein does not have conductivity, and thus the recognition rate of the digitizer DT may not be reduced.

A second support member SB2 may be positioned at a lower portion of the digitizer DT. The second support member SB2 may be adhered to the lower surface of the digitizer DT through an eighth adhesive layer 118. In an embodiment, the eighth adhesive layer 118 may not be provided in a portion corresponding to the folding area FA.

The second support member SB2 may transfer heat generated by the digitizer DT to the outside. In this case, the second support member SB2 may include a metal having good heat transfer efficiency. Alternatively, the second support member SB2 may be formed of graphite having high thermal conductivity in a plane direction. When the second support member SB2 is made of graphite, the second support member SB2 may be provided with a thinner thickness than when the second support member SB2 is made of a metal. In addition, the second support member SB2 may be positioned at the lower portion of the digitizer DT to support the digitizer DT, and may protect the digitizer DT from external impact.

The second support member SB2 includes a second-1 support member SB2-1 positioned at a left side and a second-2 support member SB2-2 positioned at a right side based on (or with respect to) the folding axis FL.

A cushion layer CS may be disposed at a lower portion of the second support member SB2. The cushion layer CS may serve to prevent or minimize damage to the digitizer DT positioned on the cushion layer CS due to an impact from the outside. In an embodiment, the cushion layer CS may include a pressure-sensitive adhesive.

A waterproof member WF may be positioned outside the cushion layer CS. The waterproof member WF may block or absorb moisture introduced from the outside of the display device DSD to prevent or minimize damage to components of the display device DSD by moisture. In this case, the waterproof member WF may be provided as a tape, a sponge, or the like.

In an embodiment, through holes TH holes TH corresponding to the first area A1 described in FIG. 4 may be respectively provided in the fifth adhesive layer 115, the first support member SB1, the sixth adhesive layer 116, the plate PT, the seventh adhesive layer 117, the digitizer DT, the eighth adhesive layer 118, the second support member SB2, and the cushion layer CS. However, the embodiment described herein is not limited thereto. The through hole may not be provided in at least one of the fifth adhesive layer 115, the first support member SB1, the sixth adhesive layer 116, the plate PT, the seventh adhesive layer 117, the digitizer DT, the eighth adhesive layer 118, the second support member SB2, or the cushion layer CS. In addition, a through hole may be additionally provided in the second protection member PL2.

It is possible to improve light transmittance of the first area A1 by respectively providing the through holes TH corresponding to the first area in the fifth adhesive layer 115, the first support member SB1, the sixth adhesive layer 116, the plate PT, the seventh adhesive layer 117, the digitizer DT, the eighth adhesive layer 118, the second support member SB2, or the cushion layer CS, thereby providing a display device with improved performance of an electronic module.

Figure 8:
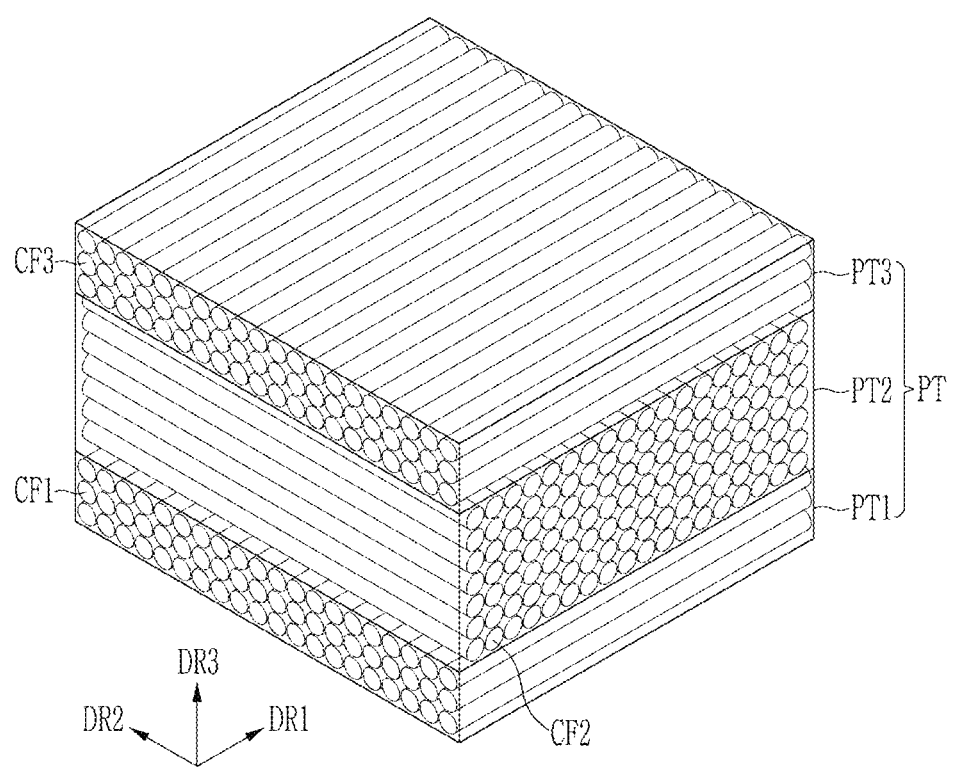
FIG. 8 illustrates a perspective view of a plate according to the present embodiment.
Figure 9:
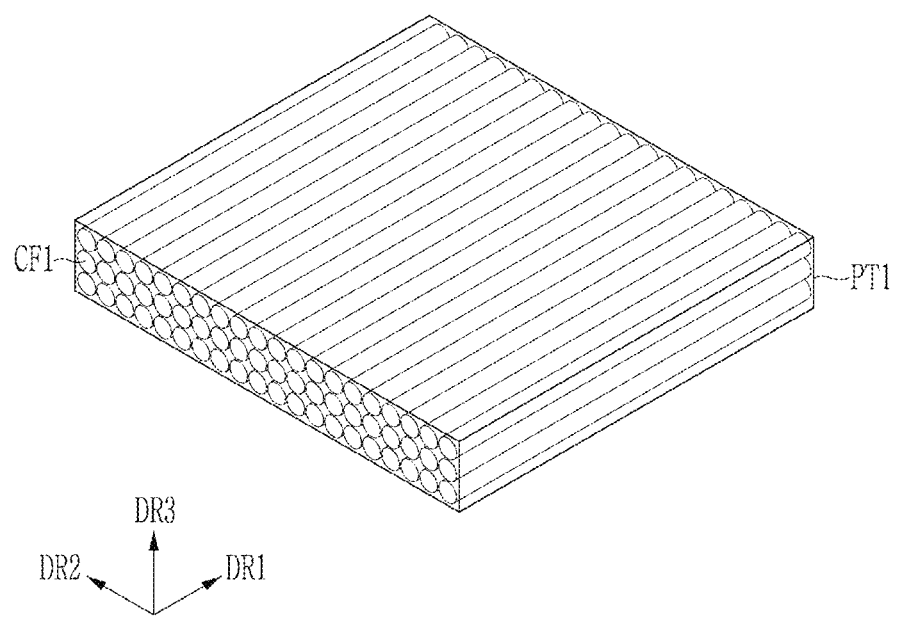
FIG. 9 illustrates a perspective view of a first layer of FIG. 8.
Figure 10:
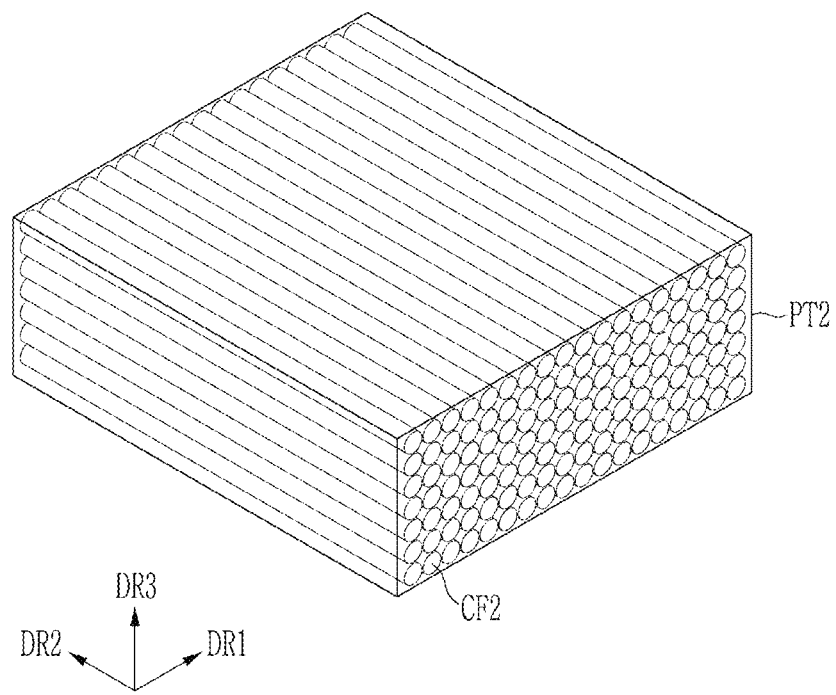
FIG. 10 illustrates a perspective view of a second layer of FIG. 8.
Figure 11:
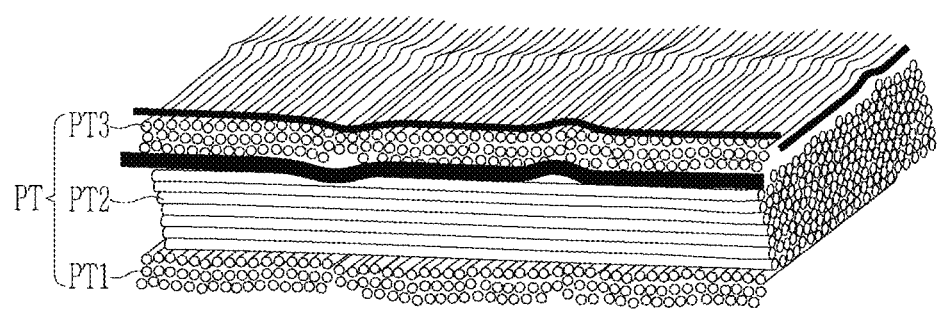
FIG. 11 illustrates a schematic cross-sectional view of a plate according to a comparative example.
Figure 12:
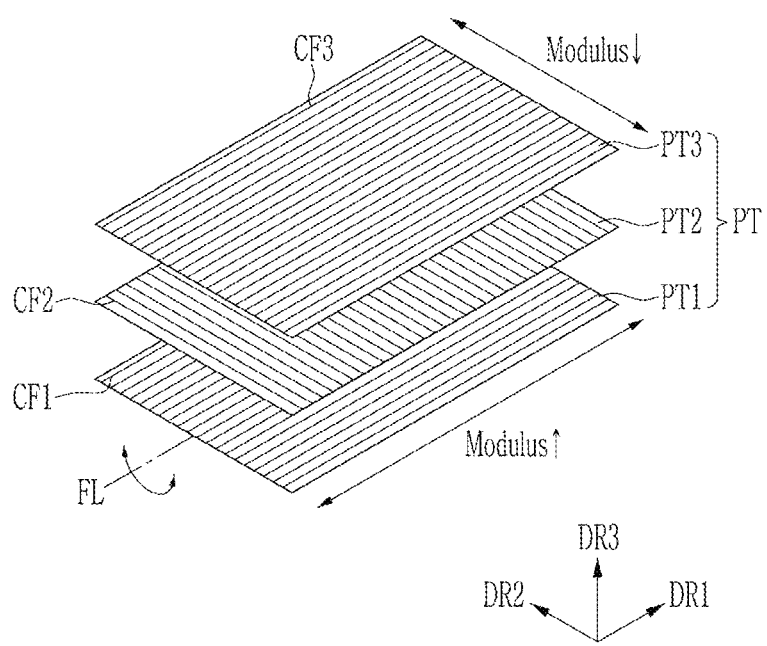
FIG. 12 illustrates a relationship between elastic modulus of first, second, and third layers of a plate and a folding axis.

Hereinafter, a plate according to an embodiment will be described in more detail with reference to FIG. 8 to FIG. 12. FIG. 8 illustrates a perspective view of a plates according to an embodiment, FIG. 9 illustrates a first layer of FIG. 8, FIG. 10 illustrates a second layer of FIG. 8, FIG. 11 illustrates a schematic perspective view of a plate according to an comparative example, and FIG. 12 illustrates a relationship between elastic modulus of first, second, and third layers of a plate and a folding axis.

Referring to FIG. 8, the plate PT may have a multi-layered structure including a first layer PT1, a second layer PT2, and a third layer PT3. In the embodiment described herein, the plate PT may be formed of an odd number of layers. That is, layers positioned at opposite outermost sides of the plate PT may include a same material.

As illustrated in FIG. 7, a plurality of grooves H may be positioned in the folding area FA of the plate PT. Accordingly, the plate PT and the display device DSD including the plate PT may be bent to realize a foldable display device.

The first layer PT1, the second layer PT2, and the third layer PT3 may each be formed of a material having anisotropy and having a different elastic modulus depending on directions. The first layer PT1 to the third layer PT3 may include carbon fiber reinforced plastic (CFRP) in which carbon fibers are arranged in one direction. The carbon fiber reinforced plastic is (CFRP) is a plastic obtained by impregnating carbon fibers CF1, CF2, and CF3 with a resin and curing it.

In this case, the first carbon fibers CF1 and CF3 included in the first layer PT1 and the third layer PT3 may be arranged such that a longitudinal direction of the first carbon fibers CF1 and CF3 is parallel to the first direction DR1. That is, the first carbon fibers CF1 and CF3 may extend in the first direction DR1. The longitudinal direction of the first carbon fibers CF1 and CF3 included in the first layer PT1 and the third layer PT3 may be parallel to a folding axis that is parallel to the first direction DR1. The longitudinal direction of the first carbon fibers CF1 and CF3 included in the first layer PT1 and the third layer PT3 may be perpendicular to a bending direction of the plate PT.

The second carbon fibers CF2 included in the second layer PT2 may be positioned along the first direction DR1. A longitudinal direction of the second carbon fibers CF2 may be parallel to the second direction DR2. That is, the second carbon fibers CF2 may extend in the second direction DR2. The longitudinal direction of the second carbon fibers CF2 included in the second layer PT2 may be perpendicular to the folding axis that is parallel to the first direction DR1. The longitudinal direction of the second carbon fibers CF2 may be parallel to the bending direction of the plate PT.

The elastic modulus is high in the longitudinal direction of the carbon fibers CF1, CF2, and CF3, while the elastic modulus is low in a direction perpendicular to the longitudinal direction of the carbon fibers CF1, CF2, and CF3. Accordingly, the plate PT may be bent well in the direction that is perpendicular to the longitudinal direction of the carbon fibers. A relationship between the elastic modulus and the folding axis for each direction of the plate PT will be separately described later with reference to FIG. 12.

FIG. 9 illustrates the first layer PT1 of FIG. 8 separately. As illustrated in FIG. 9, since the longitudinal direction of the carbon fibers CF1 is the first direction DR1, the elastic modulus of the first layer PT1 may be different for each direction. That is, the elastic modulus in the first direction DR1 along the longitudinal direction of the carbon fibers CF1 may be high, while the elastic modulus in the second direction DR2 that is perpendicular to the first direction DR1 may be low.

The display device including the plate PT according to the embodiment described herein is bent based on the folding axis that is parallel to the first direction DR1. In this case, since the elastic modulus in the second direction DR2 is low, the display device may be easily bent. FIG. 9 has been described the first layer PT1, but in the embodiment of FIG. 8, the first layer PT1 and the third layer PT3 include a same material and have a same arrangement, and thus the description of FIG. 9 is equally applied to the third layer PT3 of FIG. 8.

Hereinafter, the second layer PT2 according to an embodiment will be described with reference to FIG. 10.

The elastic modulus of the second layer PT2 may be different for each direction. The elastic modulus in the second direction DR2 that is the longitudinal direction of the carbon fibers may be high, while the elastic modulus in the first direction DR1 that is perpendicular to the second direction DR2 may be low.

Referring back to FIG. 8, the second layer PT2 positioned between the first layer PT1 and the third layer PT3 may be formed to have a different thickness from that of the first layer PT1 and the third layer PT3. Alternatively, the second layer PT2 may have a different fiber area weight (FAW) value from that of the first layer PT1 and the third layer PT3.

An entire thickness of the plate PT may be 150 μm to 250 μm. When the thickness of the plate PT is less than 150 μm, the plate PT may not sufficiently support the display module, while when the thickness of the plate PT is 250 μm or more, the plate PT may become too thick to be easily bent. However, the thickness of the plate PT is not limited thereto, and may be 200 μm or less, e.g., 180 μm or less. That is, the thickness of the plate PT may be about 150 μm to 180 μm.

The first layer PT1 and the third layer PT3 may have thicknesses of 30 μm to 40 μm, respectively. In addition, the thickness of the second layer PT2 may be 90 μm to 150 μm.

Referring to FIG. 11, it can be seen that a surface wave may be generated in the first layer PT1 or the third layer PT3 constituting an outer surface of the plate PT due to aggregation of carbon fibers, etc. However, according to an embodiment, as the thicknesses of the first layer PT1 and the third layer PT2 are thin and the thickness of the second layer PT2 is thick, the generation of the surface wave may be reduced and surface quality of the plate PT may be improved. That is, as the thicknesses of the first layer PT1 and the third layer PT3 are thicker and the thickness of the second layer PT2 is thinner, as illustrated in FIG. 11, an uneven surface may be formed, and thus, according to the embodiment described herein, the plate PT having improved surface quality may be provided by providing the relatively thin first layer PT1 and the third layer PT3, and the relatively thick second layer PT2.

All FAW values of the plate PT may be about 160 g/m$^2$ to about 210 g/m$^2$. When the FAW value of the plate PT is less than about 160 g/m$^2$, the plate PT may not sufficiently support the display module, while when the FAW value of the plate PT is about 210 g/m$^2$ or more, the plate PT may become too thick to be easily bent. However, the FAW value of the plate PT is not limited thereto, and may be about 195 g/m$^2$ or less, e.g., about 185 g/m$^2$ or less. That is, the FAW value of the plate PT may be about 160 g/m$^2$ to about 185 g/m$^2$.

The FAW value of each of the first layer PT1 and the third layer PT3 may be about 20 g/m$^2$ to 50 g/m$^2$. Alternatively, for example, the FAW value of each of the first layer PT1 and the third layer PT3 may be about 20 g/m$^2$ to 30 g/m$^2$. According to an embodiment, the FAW value of each of the first layer PT1 and the third layer PT3 may be about 20 g/m$^2$ to 25 g/m$^2$.

The FAW value of the second layer PT2 may be about 100 g/m$^2$ to about 150 g/m$^2$. Alternatively, for example, the FAW value of the second layer PT2 may be about 100 g/m$^2$ to about 150 g/m$^2$. According to an embodiment, the FAW value of the second layer PT2 may be about 125 g/m$^2$.

FIG. 12 illustrates a relationship between a modulus (i.e., an elastic modulus) of the first layer PT1, the second layer PT2, and the third layer PT3 of the plate PT and the folding axis FL.

Referring to FIG. 12, the first layer PT1 and the third layer PT3 are arranged such that the longitudinal directions of the carbon fibers CF1 and CF3 are parallel to the first direction DR1. The second layer PT2 is positioned such that the longitudinal direction of the carbon fibers CF2 are parallel to the second direction DR2.

According to an embodiment, the elastic modulus of the plate PT along the first direction DR1 may be greater than the elastic modulus along the second direction DR2. For example, the elastic modulus of the plate PT in the first direction DR1 may be about 50 to 60 GPa, and the elastic modulus of the plate PT in the second direction DR2 may be about 20 to 30 GPa.

The folding axis FL of the plate PT along the first direction DR1 is positioned in parallel with the first direction DR1. The plate PT may be folded in the second direction DR2 is with the folding axis FL therebetween, and in this case, the plate PT having a low elastic modulus of the plate PT in the second direction DR2 may be easily folded.

Figure 13:
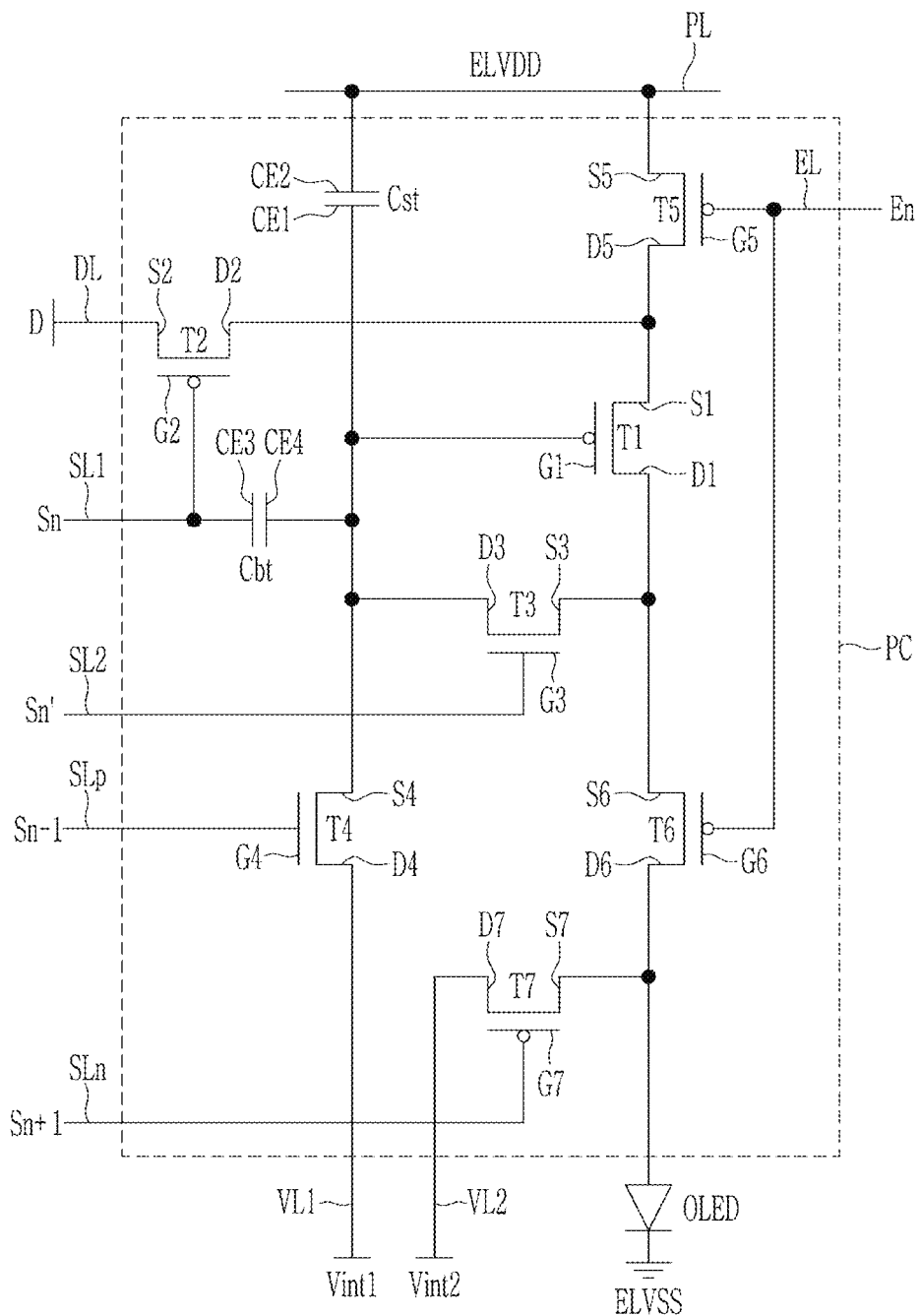
FIG. 13 illustrates an equivalent circuit diagram of a pixel according to an embodiment.

FIG. 13 illustrates an equivalent circuit diagram of a pixel according to an embodiment. Specifically, FIG. 13 illustrates a circuit diagram of the pixel PX included in the display module DM (FIG. 2). The circuit diagram of the pixel PX illustrated in FIG. 13 has only a difference in size, and may be equally applied not only to a first pixel positioned in the first area A1 but also to a second pixel positioned in the second area A2.

In an embodiment, the pixel circuit PC includes a first transistor T1, a second transistor T2, a third transistor T3, a fourth transistor T4, a fifth transistor T5, a sixth transistor T6, a seventh transistor T7, a first storage capacitor Cst, and a second storage capacitor Cbt. In an embodiment, at least one of the first to seventh transistors T1 to T7 may be omitted.

The first to seventh transistors T1, T2, T3, T4, T5, T6, and T7 and the first and second storage capacitors Cst and Cbt may be connected to signal lines, a first initialization voltage line VL1, a second initialization voltage line VL2, and a driving voltage line PL. The signal lines may include a data line DL, a first scan line SL1, a second scan line SL2, a previous scan line SLp, a subsequent scan line SLn, and an emission control line EL. In an embodiment, the signal lines, the first and second initialization voltage lines VL1 and VL2, and/or the driving voltage line PL may be shared by neighboring pixels.

The driving voltage line PL may transfer a first driving voltage ELVDD to the first transistor T1. The first initialization voltage line VL1 may transfer a first initialization voltage Vint1 for initializing the first transistor T1 to the pixel circuit PC. The second initialization voltage line VL2 may transfer a second initialization voltage Vint2 for initializing a light emitting diode LED to the pixel circuit PC.

Among the first to seventh transistors T1 to T7, the third transistor T3 and the fourth transistor T4 may each be implemented as an n-channel MOSFET (NMOS), and the others may each be implemented as a p-channel MOSFET (PMOS). However, the embodiment described herein is not limited thereto.

As used herein, "electrically connected between a transistor and a signal line or a transistor and a transistor" indicates "a source, a drain, and a gate of the transistor have an integral shape with the signal line or are connected through a connection electrode".

The first transistor T1 may control a magnitude of a driving current flowing from the driving voltage line PL to the light emitting diode OLED depending on a gate voltage. The first transistor T1 may have a gate G1 connected to a first electrode CE1 of the first storage capacitor Cst, and a source S1 connected to the driving voltage line PL through a fifth transistor T5. In addition, the first transistor T1 may further have a drain D1 connected to the light emitting diode OLED through the sixth transistor T6.

The second transistor T2 may receive a data voltage D in response to a first scan signal Sn. The second transistor T2 may transmit the data voltage D to the source S1 of the first transistor T1 in response to the first scan signal Sn. The second transistor T2 may have a gate G1 connected to the first scan line SL1, a source S2 connected to the data line DL, and a drain D2 connected to the source S1 of the first transistor T1.

The first storage capacitor Cst may be connected between the driving voltage line PL and the first transistor T1. The first storage capacitor Cst may include a second electrode CE2 connected to the driving voltage line PL, and a first electrode CE1 connected to the gate G1 of the first transistor T1. The first storage capacitor Cst may store a difference between the first driving voltage ELVDD applied to the driving voltage line PL and a gate voltage of the first transistor T1, and may maintain the gate voltage of the first transistor T1.

The third transistor T3 may be connected in series between the drain D1 and the gate G1 of the first transistor T1, and the drain D1 and the gate G1 of the first transistor T1 may be connected to each other in response to a second scan signal Sn'. The third transistor T3 may have a gate G3 connected to the second scan line SL2, a source S3 connected to the drain D1 of the first transistor T1, and a drain D3 connected to the gate G1 of the first transistor T1. The third transistor T3 may include a plurality of transistors that are connected in series to each other and simultaneously controlled by the first scan signal Sn. However, the third transistor T3 may be omitted.

When the third transistor T3 is turned on in response to the second scan signal Sn', the drain D1 and the gate G1 of the first transistor T1 are connected to each other so that the first transistor T1 may be diode-connected.

The fourth transistor T4 may apply a first initialization voltage Vint1 to the gate G1 of the first transistor T1 in response to a previous scan signal S(n−1). The fourth transistor T4 may have a gate G4 connected to a previous scan line SLp, a source S4 connected to the gate G1 of the first transistor T1, and a drain D4 connected to the first initialization voltage line VL1. The fourth transistor T4 may include a plurality of transistors that are connected in series to each other and simultaneously controlled by the previous scan signal S(n−1). However, the fourth transistor T4 may be omitted.

The fifth transistor T5 may connect the driving voltage line PL and the source S1 of the first transistor T1 to each other in response to an emission control signal En. The fifth transistor T5 may have a gate G5 connected to the emission control line EL, a source S5 connected to the driving voltage line PL, and a drain D5 connected to the source S1 of the first transistor T1. However, the fifth transistor T5 may be omitted in some implementations of the embodiment.

The sixth transistor T6 may connect the drain D1 of the first transistor T1 and an anode of the light emitting diode OLED to each other in response to the emission control signal En. The sixth transistor T6 may transfer the driving current outputted from the first transistor T1 to an anode of the light emitting diode OLED. The sixth transistor T6 may have a gate G6 connected to the emission control line EL, a source S6 connected to the drain D1 of the first transistor T1, and a drain D6 connected to the anode of the light emitting diode OLED. However, the sixth transistor T6 may be omitted in some implementations of the embodiment.

The seventh transistor T7 may apply a first initialization voltage Vint2 anode of the light emitting element OLED in response second a Hereinafter scan signal S(n+1). The seventh transistor T7 may have a gate G7 connected to the scan line SLn, a source S7 connected to the anode of the light emitting element OLED, and a drain D7 connected to the second initialization voltage line VL2. However, the seventh transistor T7 may be omitted in some implementations of the embodiment.

The seventh transistor T7 may then be connected to the scan line SLn. Alternatively, the seventh transistor T7 may be connected to the emission control line EL, and may be driven depending on the emission control signal En. Alternatively, the seventh transistor T7 may be connected to a previous scan line SLp, and may be driven depending on a previous scan signal SLp.

Positions of the sources and drains may be changed depending on a type (p-type or n-type) of the transistor.

The second storage capacitor Cbt may include a third electrode CE3 and a fourth electrode CE4. The fourth electrode CE4 of the second storage capacitor Cbt may be connected to the first electrode CE1 of the first storage capacitor Cst, and the third electrode CE3 of the second storage capacitor Cbt may receive the first scan signal Sn. The second storage capacitor Cbt may compensate for a voltage drop at a gate terminal by increasing a voltage of the gate terminal of the first transistor T1 at a time when supply of the first scan signal Sn is stopped. However, the second storage capacitor Cbt may be omitted in some implementations of the embodiment.

Although it has been described that one pixel PX includes seven transistors T1 to T7 and two capacitors (a holding capacitor Cst and a boost capacitor Cboost), the embodiment described herein is not limited thereto, and the boost capacitor Cboost may be excluded depending on the embodiment. In addition, although an embodiment in which the third transistor and the fourth transistor each are formed of an n-type transistor is provided, only one of them may be formed of an n-type transistor or the other transistor may be formed of an n-type transistor. In another embodiment, all of the seven transistors may be changed to a p-type transistor or an n-type transistor.

Figure 14:
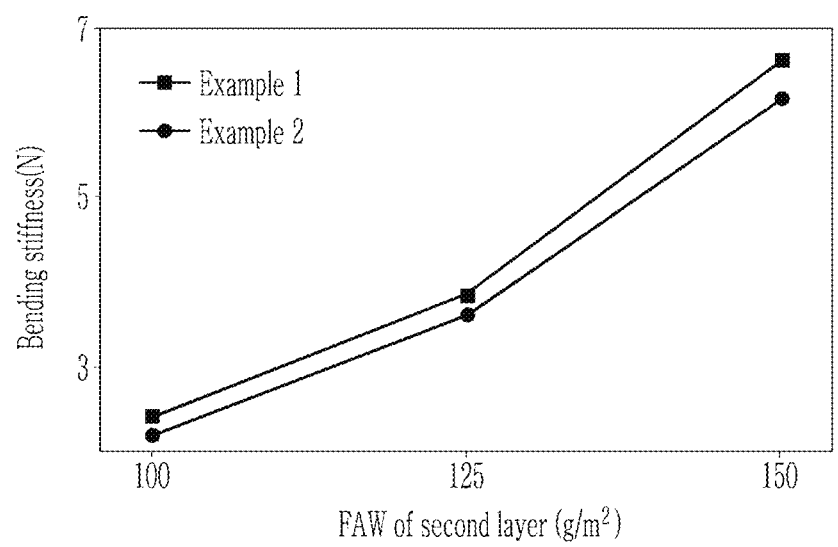
FIG. 14 illustrates a graph showing bending stiffness of a plate according to an embodiment.

Hereinafter, plates according to an example and a comparative example will be described with reference to FIG. 14 to FIGS. 16A-16G. FIG. 14 illustrates a graph showing bending stiffness of a plate according to an embodiment, FIG. 15 illustrates a surface image of a plate according to the embodiment of FIG. 14, and FIGS. 16A-16G illustrate a surface image of a plate according to an example and a comparative example.

Referring to FIG. 14 first, in Example 1, the FAW values of the first layer and the third layer are 30 g/m$^2$, and in Example 2, the FAW values of the first layer and the third layer are 22 g/m$^2$. For each of Examples 1 and 2, it was examined whether the bending stiffness and surface quality were improved as the FAW value of the second layer was changed.

As illustrated in FIG. 14, It was confirmed that both Examples 1 and 2 increased the bending stiffness as the FAW value of the second layer was increased to 100 g/m$^2$, 125 g/m$^2$, and 150 g/m$^2$. In particular, although the FAW values of the first and third layers were reduced to 22 g/m$^2$ in the case of Example 2 compared to Example 1, it was confirmed that a degree of bending stiffness that is similar to that of Example 1 was exhibited.

Figure 15:
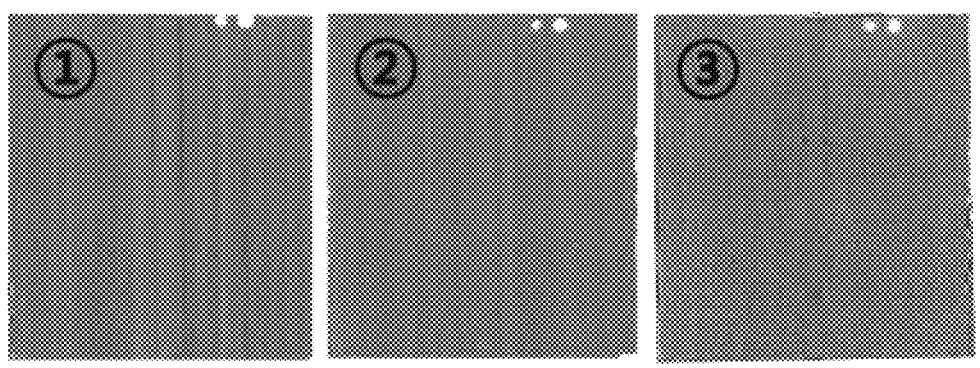
FIG. 15 illustrates a surface image of a plate according to the embodiment of FIG. 14.

FIG. 15 (1) illustrates a case in which the FAW value of the second layer in Example 2 of FIG. 14 is 100 g/m$^2$, FIG. 15 (2) illustrates a case in which the FAW value of the second layer is 125 g/m$^2$ in Example 2 of FIG. 14, and FIG. 15 (3) illustrates a case in which the FAW value of the second layer in Example 2 of FIG. 14 is 150 g/m$^2$. For images of FIG. 15, it can be seen that, when the thicknesses of the first layer and the third layer are the same, as the FAW of the second layer increases, waves that are visible on a surface of the plate decreases. That is, it was confirmed that as the thickness of the second layer increased, the surface quality of the plate was improved.

Figure 16A:
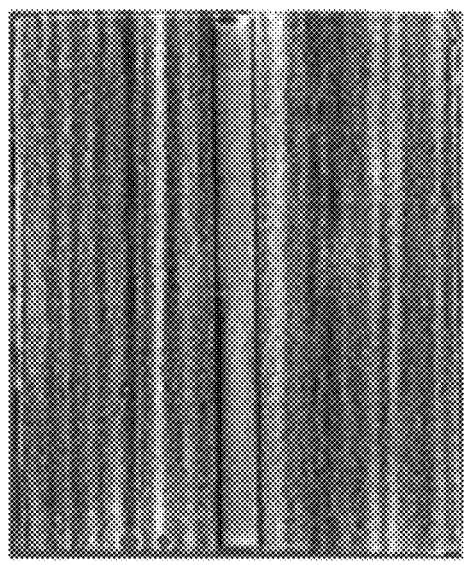
FIGS. 16A-16G illustrate a surface image of a plate according to an example and a comparative example.
Figure 16B:
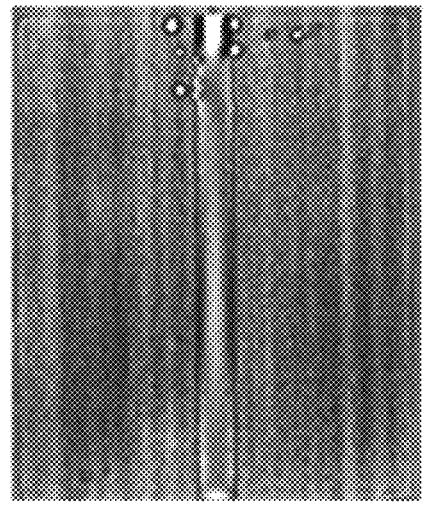
Figure 16C:
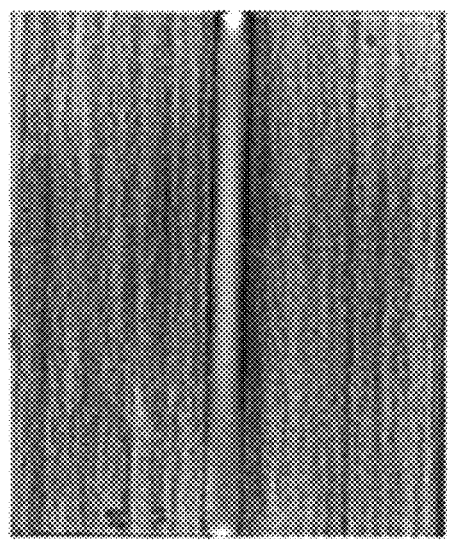
Figure 16D:
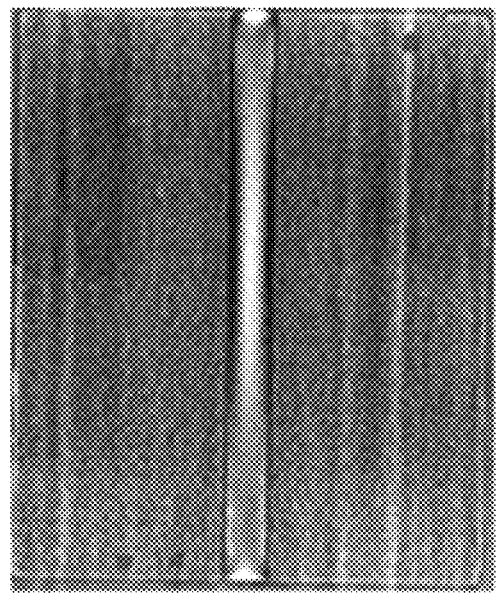
Figure 16E:
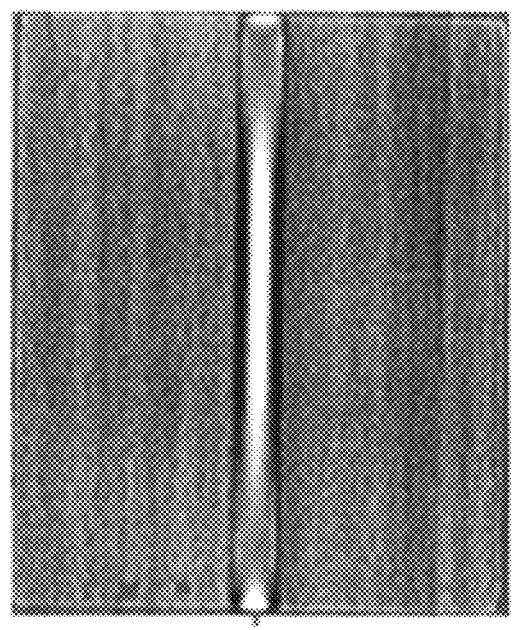
Figure 16F:
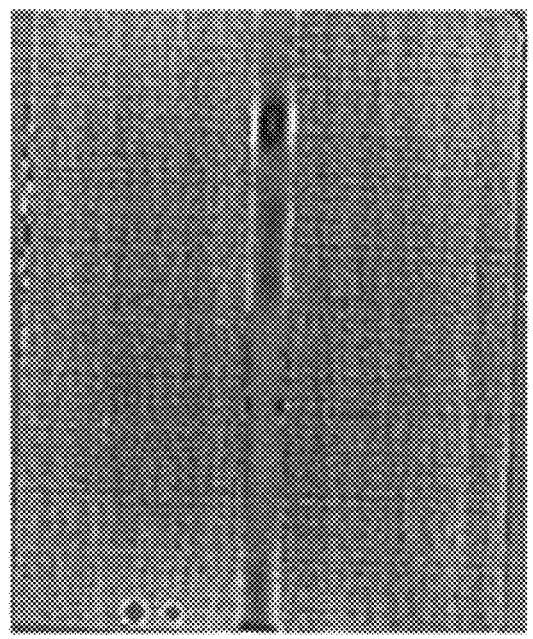
Figure 16G:
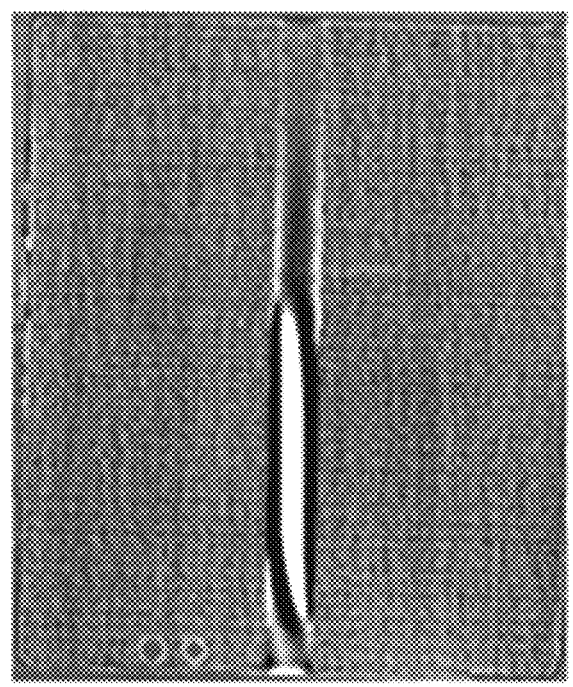

Next, referring to FIGS. 16A-16G, in FIG. 16A, the FAW of the first layer and the third layer is 30 g/m$^2$, the FAW of the second layer is 100 g/m$^2$, and a total thickness of the plate is about 0.17 mm. In FIG. 16B, the FAW of the first layer and the third layer is 22 g/m$^2$, the FAW of the second layer is 125 g/m$^2$, and a total thickness of the plate is about 0.176 mm. In FIG. 16C, the FAW of the first layer and the third layer is 30 g/m$^2$, the FAW of the second layer is 125 g/m$^2$, and a total thickness of the plate is about 0.192 mm. In FIG. 16D, the FAW of the first layer and the third layer is 22 g/m$^2$, the FAW of the second layer is 150 g/m$^2$, and a total thickness of the plate is about 0.198 mm. In FIG. 16E, the FAW of the first layer and the third layer is 30 g/m$^2$, the FAW of the second layer is 150 g/m$^2$, and a total thickness of the plate is about 0.22 mm. In FIG. 16F, the FAW of the first layer and the third layer is 22 g/m$^2$, the FAW of the second layer is 200 g/m$^2$, and a total thickness of the plate is about 0.258 mm. In FIG. 16G, the FAW of the first layer and the third layer is 30 g/m$^2$, the FAW of the second layer is 200 g/m$^2$, and a total thickness of the plate is about 0.276 mm.

Referring to an image attached to FIG. 16, it can be seen that as the FAW of the second layer increases, the wave formed on the surface of the plate is ameliorated, and the surface quality is improved. However, in the cases of FIG. 16F and FIG. 16G, as the elastic modulus in the second direction exceeds 30 GPa, it may be difficult to fold the display device. In addition, in the cases of FIG. 16F and FIG. 16G, as the thickness of the plate becomes excessively thick, it may not be easy to fold the display device.

On the other hand, in the cases of FIG. 16A to FIG. 16E, it was confirmed that as the FAW of the second layer increased, the plate had elastic modulus in the first and second directions to be satisfied while the surface quality of the plate was improved. Among them, it was confirmed that, in the case of the example of FIG. 16B, while having a thin thickness, the surface quality can be improved compared to FIG. 16A, and other physical properties (elastic modulus, strength, etc.) are similar to those of FIG. 16A.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display module;
a plate positioned on a rear surface of the display module; and
a digitizer positioned on a rear surface of the plate,
wherein the plate includes a first layer, a second layer, and a third layer each including carbon fiber reinforced plastic, and
a fiber area weight (FAW) of the second layer is 100 g/m$^2$ to 150 g/m$^2$.

2. The display device of claim 1, wherein
a FAW of each of the first layer and the third layer are 20 g/m$^2$ to 30 g/m$^2$.

3. The display device of claim 1, wherein
a FAW of the plate is 160 g/m$^2$ to 210 g/m$^2$.

4. The display device of claim 1, wherein
a thickness of the second layer is 90 μm to 150 μm.

5. The display device of claim 1, wherein
thicknesses of the first layer and the third layer are the same, and
a thickness of each of the first layer and the third layer is 30 μm to 40 μm.

6. The display device of claim 1, wherein
a thickness of the plate is 150 μm to 250 μm.

7. The display device of claim 1, wherein
the first layer to the third layer include a plurality of carbon fibers,
a longitudinal direction of a first carbon fiber included in the first layer and the third layer is parallel to a first direction, and
a longitudinal direction of a second carbon fiber included in the second layer is parallel to a second direction.

8. The display device of claim 7, wherein
the display device is folded based on a folding axis, and
the folding axis is parallel to the first direction.

9. The display device of claim 8, wherein
the plate includes a folding area that overlaps the folding axis and a folding peripheral area that does not overlap the folding axis, and
the plate has a plurality of grooves positioned in the folding area.

10. The display device of claim 7, wherein
an elastic modulus of the plate in the first direction is greater than that in the second direction.

11. A display device comprising:
a display module that is foldable with respect to a folding axis; and
a plate positioned on a rear surface of the display module,
wherein the plate includes a first layer, a second layer, and a third layer each including carbon fiber reinforced plastic,
a fiber area weight (FAW) of the second layer is 100 g/m2 to 150 g/m2, and
an elastic modulus of the plate in a direction perpendicular to the folding axis is smaller than that in a direction that is parallel to the folding axis.

12. The display device of claim 11, wherein
each FAW of the first layer and the third layer is 20 g/m$^2$ to 30 g/m$^2$.

13. The display device of claim 11, wherein
the FAW of the plate is 160 g/m$^2$ to 210 g/m$^2$.

14. The display device of claim 11, wherein
a thickness of the second layer is 90 μm to 150 μm.

15. The display device of claim 11, wherein
thicknesses of the first layer and the third layer are the same, and
a thickness of each of the first layer and the third layer is 30 μm to 40 μm.

16. The display device of claim 11, wherein
a thickness of the plate is 150 μm to 250 μm.

17. The display device of claim 11, wherein
the first layer to the third layer include a plurality of first carbon fibers,
a longitudinal direction of the first carbon fibers is parallel to the first direction,
the second layer includes a plurality of second carbon fibers, and
a longitudinal direction of the second carbon fibers is parallel to a second direction.

18. The display device of claim 17, wherein
the folding axis is parallel to the first direction.

19. The display device of claim 18, wherein
the plate includes a folding area that overlaps the folding axis and a folding peripheral area that does not overlap the folding axis, and
the plate has a plurality of grooves positioned in the folding area.

20. The display device of claim 17, further comprising a digitizer positioned on a rear surface of the plate.

* * * * *